(12) United States Patent
Xiao et al.

(10) Patent No.: US 11,439,032 B2
(45) Date of Patent: Sep. 6, 2022

(54) COMMUNICATION DEVICE BOARD AND COMMUNICATION DEVICE

(71) Applicant: New H3C Technologies Co., Ltd., Zhejiang (CN)

(72) Inventors: Chenfei Xiao, Beijing (CN); Jin Xu, Beijing (CN)

(73) Assignee: New H3C Technologies Co., Ltd., Zhejiang (CN)

( * ) Notice: Subject to any disclaimer, the term of this patent is extended or adjusted under 35 U.S.C. 154(b) by 338 days.

(21) Appl. No.: 16/649,609

(22) PCT Filed: Sep. 26, 2018

(86) PCT No.: PCT/CN2018/107576
§ 371 (c)(1),
(2) Date: Mar. 20, 2020

(87) PCT Pub. No.: WO2019/062752
PCT Pub. Date: Apr. 4, 2019

(65) Prior Publication Data
US 2020/0275575 A1    Aug. 27, 2020

(30) Foreign Application Priority Data

Sep. 26, 2017    (CN) .......................... 201710882782.X

(51) Int. Cl.
*H05K 7/14*    (2006.01)
*H05K 7/02*    (2006.01)

(52) U.S. Cl.
CPC .......... *H05K 7/1487* (2013.01); *H05K 7/023* (2013.01); *H05K 7/026* (2013.01)

(58) Field of Classification Search
None
See application file for complete search history.

(56) References Cited

U.S. PATENT DOCUMENTS 5,743,749 A * 4/1998 Kurakane .......... H01R 13/2464
439/71
5,991,158 A * 11/1999 Chan .................. G06F 1/184
361/736

(Continued)

FOREIGN PATENT DOCUMENTS

CN    101742863 A    6/2010
CN    101795421 A    8/2010

(Continued)

OTHER PUBLICATIONS

ISA State Intellectual Property Office of the People's Republic of China, International Search Report Issued in Application No. PCT/CN2018/107576, dated Jan. 7, 2019, WIPO, 5 pages.

(Continued)

*Primary Examiner* — James Wu
*Assistant Examiner* — Christopher L Augustin
(74) *Attorney, Agent, or Firm* — McCoy Russell LLP

(57) ABSTRACT

Communication device board and a communication device are provided. A connector of the communication device board includes a fixed position and a contact position. The fixed position and the contact position; have different levels. The fixed position is fixedly connected one end of an inner side of a conductive resilient sheet. An outer side of the conductive sheet is provided with an insulating coating. When the fixed position fixedly connected to the end of the inner side of the conductive resilient sheet, and a mating gap between the connector of the communication device board and a corresponding communication device connector is smaller than a preset threshold range, A second end of the inner side of the conductive resilient sheet is in contact with the contact position (12).

16 Claims, 17 Drawing Sheets

(56) References Cited

U.S. PATENT DOCUMENTS

| | | | | |
|---|---|---|---|---|
| 7,244,125 | B2* | 7/2007 | Brown | H01R 12/52 |
| | | | | 439/74 |
| 9,570,821 | B2* | 2/2017 | Yamakami | H01R 12/53 |
| 2001/0017771 | A1* | 8/2001 | Matsumiya | H05K 5/026 |
| | | | | 361/800 |
| 2003/0060069 | A1* | 3/2003 | Duquerroy | H01R 24/50 |
| | | | | 439/188 |
| 2004/0177995 | A1 | 9/2004 | Karavakis et al. | |
| 2009/0244831 | A1 | 10/2009 | Nemoz et al. | |
| 2013/0033831 | A1 | 2/2013 | Wang et al. | |

FOREIGN PATENT DOCUMENTS

| | | | |
|---|---|---|---|
| CN | 102496794 | A | 6/2012 |
| CN | 102630137 | A | 8/2012 |
| CN | 102927895 | A | 2/2013 |
| CN | 203708364 | U | 7/2014 |
| CN | 104717863 | A | 6/2015 |
| CN | 206339601 | U | 7/2017 |
| CN | 107086385 | A | 8/2017 |
| DE | 10052624 | A1 | 5/2002 |
| JP | H06310220 | A | 11/1994 |
| JP | 2019079703 | A | 5/2019 |
| WO | 2017074315 | A1 | 5/2017 |

OTHER PUBLICATIONS

State Intellectual Property Office of the People's Republic of China, Office Action and Search Report Issued in Application No. 201710882782.X, dated Jun. 26, 2019, 12 pages. (Submitted with Partial Translation).

Japanese Patent Office, Office Action Issued in Application No. 2020-517358, dated Jun. 22, 2021, 11 pages. (Submitted with Machine Translation).

ISA State Intellectual Property Office of the People's Republic of China, Written Opinion of the International Searching Authority Issued in Application No. PCT/CN2018/107576, dated Jan. 7, 2019, WIPO, 8 pages.

European Patent Office, Extended European Search Report Issued in Application No. 18860074.6, dated Sep. 11, 2020, Germany, 6 pages.

* cited by examiner

COMMUNICATION DEVICE BOARD AND COMMUNICATION DEVICE

CROSS-REFERENCE TO RELATED APPLICATIONS

The present application is a U.S. National Phase of International Patent Application Serial No. PCT/CN2018/107576 entitled "COMMUNICATION DEVICE SINGLE BOARD AND COMMUNICATION DEVICE," filed on Sep. 26, 2018. International Patent Application Serial No. PCT/CN2018/107576 claims priority to Chinese Patent Application No. 201710882782.X filed on Sep. 26, 2017The entire contents of each of the above-listed applications are hereby incorporated by reference for all purposes.

BACKGROUND

A rack with insertion and removal module may refer to a rack with modular design in which all modules such as service boards, main control boards, network boards, fans and power supply(s) are independent. Signals between the modules are transmitted through connectors and the modules are fixed through structural parts to form a system.

In the rack, a circuit board of a module can be fixed in a handle bar component which has a tray structure. The handle bar component can be fastened and pulled out by levers which are on the handle bar component. Thus, modules of the rack are insertion and removal, the configuration of the modules in rack is flexible. The rack supports redundant modules, and it is convenient to repair and maintain the modules in the rack.

An existing rack with insertion and removal module may be assembled by fastening the handle bar component and tightening a screw into an outer side of a structural part so as to ensure that a mating gap between the modules satisfies requirements.

DETAILED DESCRIPTION OF THE EMBODIMENTS

To enable persons skilled in the art to better understand technical solutions in examples of the present disclosure and make the above objects, characteristics and advantages of the examples of the present disclosure more apparent and intelligible, the technical solutions in the examples of the present disclosure will be further described in detail below in conjunction with accompanying drawings.

In an assembling manner of an existing rack with insertion and removal module, actual connection positions between modules, e.g., connectors between modules, are located in a chassis. Thus, it is very difficult to determine whether a mating gap between modules reaches a design requirement only by external observation. In view of this, the present disclosure discloses a communication device board and a communication device to solve the technical problem.

Figure 1:
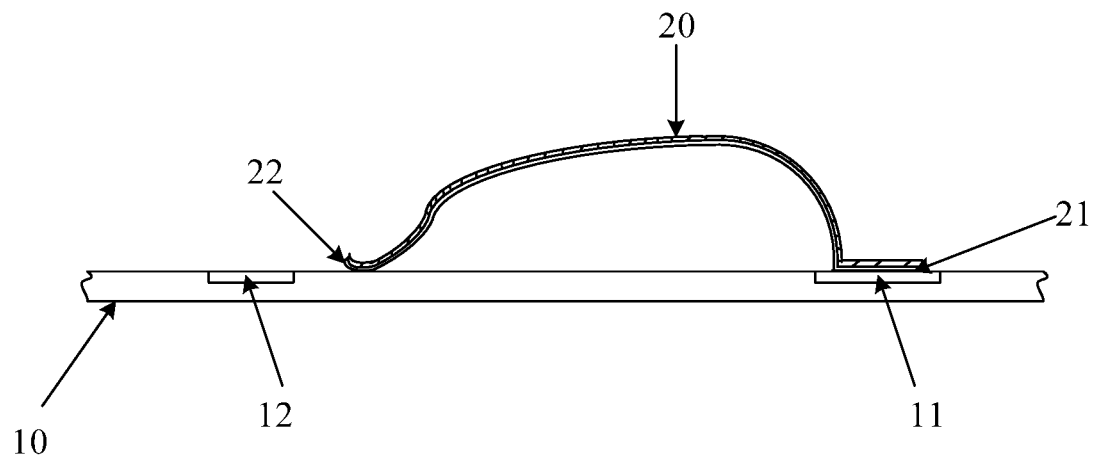
FIG. 1 is a schematic diagram of a communication device board provided based on an example of the present disclosure.

FIG. 1 is a schematic diagram of a communication device board provided based on an example of the present disclosure, where the communication device board may be applied to a communication device. As shown in FIG. 1, a connector of a communication device board 10 includes a fixed position 11 and a contact position 12, where a level of the fixed position 11 is different from a level of the contact position 12.

The fixed position 11 is used to be fixedly connected to one end 21 of an inner side of a conductive resilient sheet 20 (e.g., a side close to the communication device board 10), where an outer side of the conductive resilient sheet 20 (e.g., a side facing away from the communication device board 10) is provided with an insulating coating.

Figure 7A:
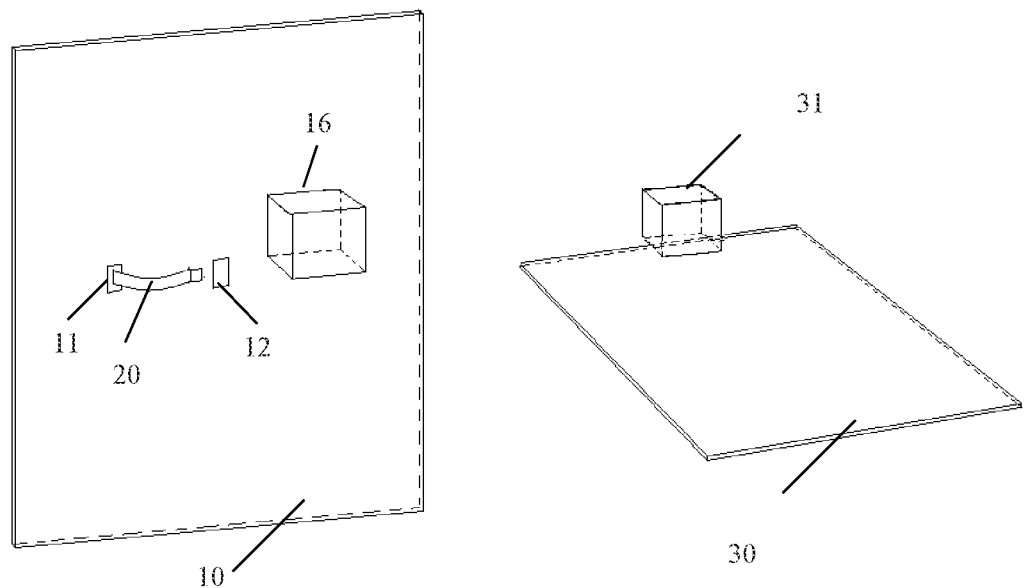
FIG. 7A is a structural illustration of a communication device board and a communication device.
Figure 7B:
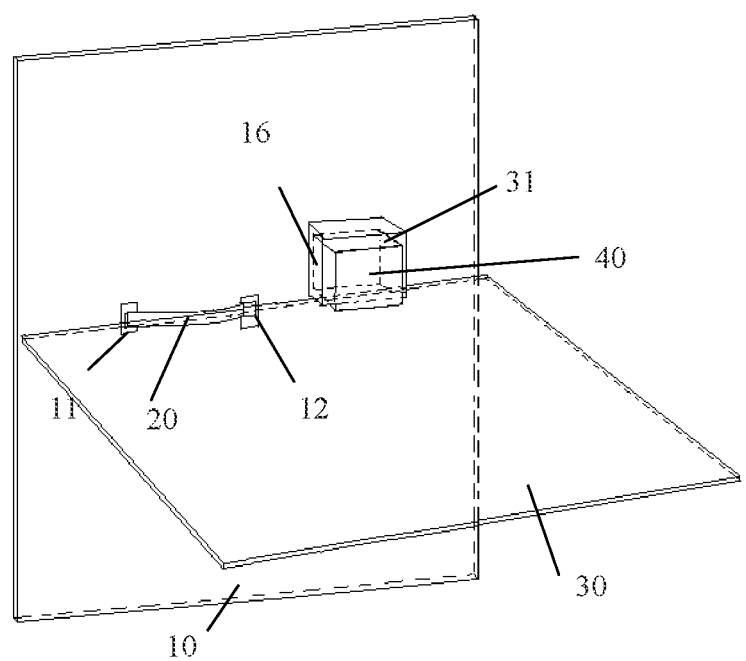
FIG. 7B is a structural illustration of a connector of a communication device board and a corresponding connector in a communication device being properly connected.

As shown in FIG. 7A and FIG. 7B, when the fixed position 11 is fixedly connected to the end 21 of the inner side of the conductive resilient sheet 20 and a mating gap 40 between a connector 16 of the communication device board 10 and a corresponding connector 31 in a rack is smaller than a preset threshold range, the other end 22 of the inner side of the conductive resilient sheet 20 is in contact with the contact position 12.

In an example of the present disclosure, since the level of the fixed position 11 is different from the level of the contact position 12, when one end 21 of the inner side of the conductive resilient sheet 20 is fixedly connected to the fixed position 11 and the other end 22 of the inner side of the conductive resilient sheet 20 is in contact with the contact position 12, the level of the fixed position 11 or the level of contact position 12 could be changed. Therefore, by detecting transitions of the level of the fixed position 11 or the level of the contact position 12, whether the other end 22 of the inner side of the conductive resilient sheet 20 is in contact with the contact position 12 could be determined. Further, whether the mating gap between the connector of the communication device board 10 and the corresponding connector in the communication device is smaller than the preset threshold range could be determined.

As shown in FIG. 7B, when the connector 16 of the communication device board 10 and the corresponding connector 31 in the communication device 30 are properly connected, that is, the communication device board 10 is properly plugged-in, the mating gap 40 between the connector 16 of the communication device board 10 and the corresponding connector 31 in the communication device 30 is smaller than the preset threshold range.

Figure 2:
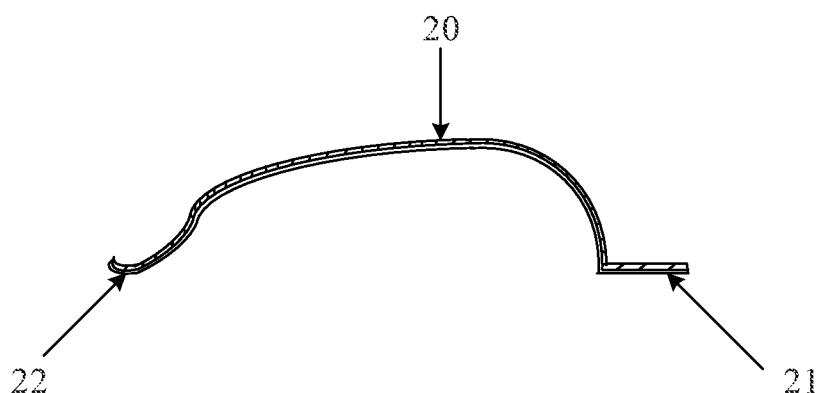
FIG. 2 is a schematic diagram of a conductive resilient sheet provided based an example of the present disclosure.

FIG. 2 is a schematic diagram of a conductive resilient sheet provided based on an example of the present disclosure. The conductive resilient sheet 20 may be made of a metal conductive material, and the outer side of the conductive resilient sheet 20 is provided with an insulating coating. The conductive resilient sheet 20 may be deformed when subject to a force, and may be restored to an original state without being subjected to a force.

Correspondingly, one conductive end 21 of the inner side of the conductive resilient sheet 20 is fixedly connected to the fixed position 11 of the connector of the communication device board 10. When the communication device board 10 is plugged into the communication device, as the connector of the communication device board 10 and the corresponding connector in the communication device are gradually tightened, the conductive resilient sheet 20 may be extended due to a force, and a position at which the other end 22 of the inner side of the conductive resilient sheet 20 is in contact with the connector of the communication device board 10 may also be changed. When the communication device board 10 is properly plugged-in, that is, the mating gap between the connector of the communication device board 10 and the corresponding connector in the communication device reaches the preset threshold range, the other end 22 of the inner side of the conductive resilient sheet 20 may be in contact with the contact position 12 of the connector of the communication device board 10.

To enable persons skilled in the art to better understand technical solutions of examples of the present disclosure, the technical solutions of examples of the present disclosure will be described below in conjunction with the specific examples.

Example 1

Figure 3A:
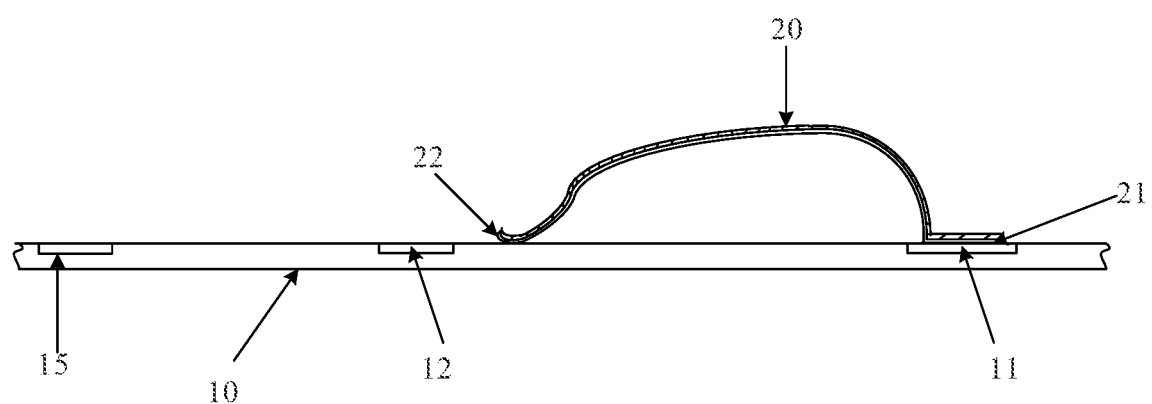
FIGS. 3A-3E are schematic diagrams and circuit diagrams of a communication device board based on a first example.

FIG. 3A is a structural diagram of a communication device board provided based on an example of the present disclosure. As shown in FIG. 3A, on the basis of the communication device board shown in FIG. 2, the communication device board 10 may also include a logic chip 15.

The logic chip 15 is connected to the contact position 12, so as to detect a level state transition of the contact position 12 and generate a corresponding level transition signal.

Figure 3B:
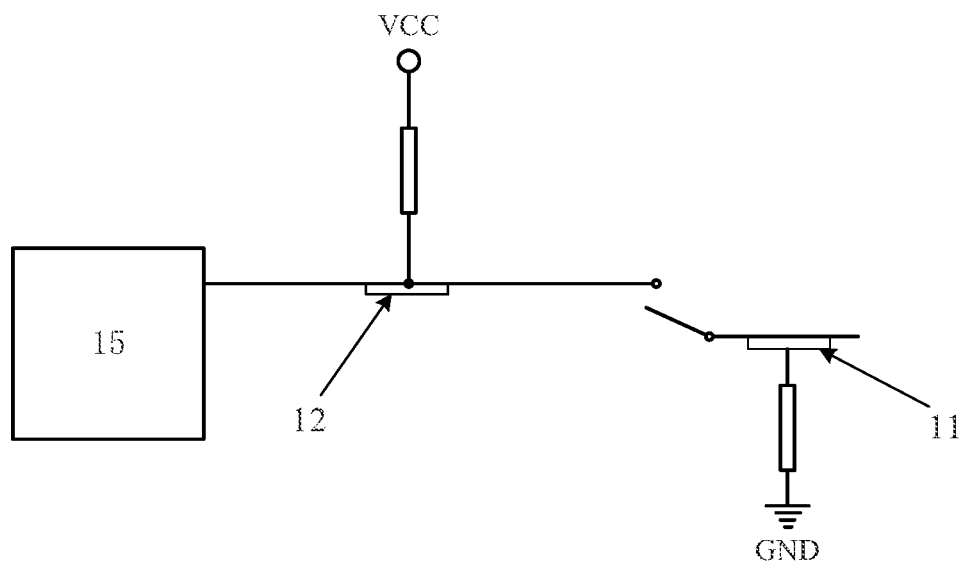

In one manner of the example, a circuit diagram, illustrating an operation principle of the communication device board 10, may be as shown in FIG. 3B, where the fixed position 11 of the connector of the communication device board 10 is grounded, and the contact position 12 of the connector is connected to a preset power supply.

It is to be noted that, in examples of the present disclosure, all mentioned groundings refer to grounding through a resistor and all connections to a power supply refer to the power supply connected through a resistor, unless otherwise specified, which will not be repeated below in the examples of the present disclosure.

In this manner, when the connector of the communication device board 10 is not connected with the corresponding connector in the communication device, the other end 22 of the inner side of the conductive resilient sheet 20 is in contact with a region (a region is located between the fixed position 11 and the contact position 12) other than the contact position 12 of the connector of the communication device board 10. At this time, the logic chip 15 detects that the contact position 12 is at a high level.

Figure 3C:
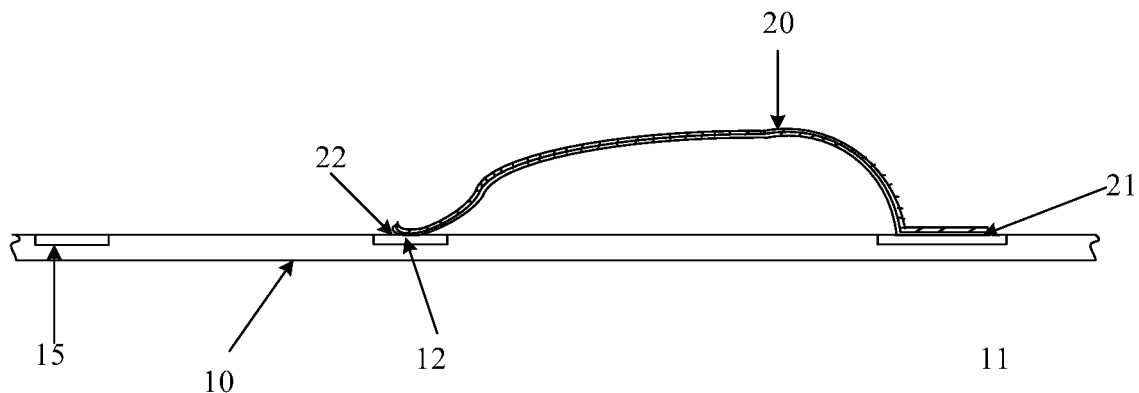
Figure 3D:
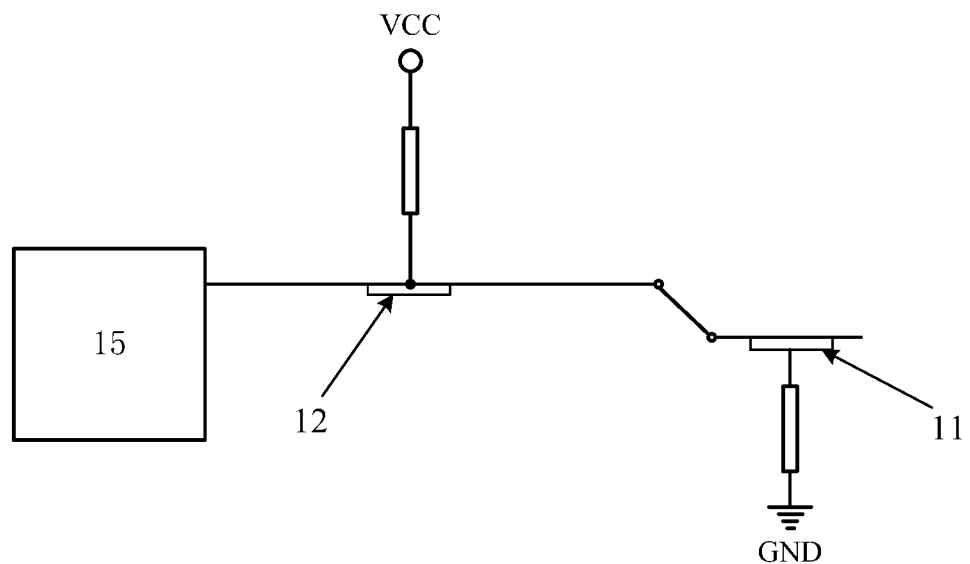

When the communication device board 10 is plugged into the communication device and the connector of the communication device board 10 is gradually and closely connected to the corresponding connector in the communication device, the other end 22 of the inner side of the conductive resilient sheet 20 gradually goes close to the contact position 12 since the conductive resilient sheet 20 is subject to a force. When the connector of the communication device board 10 is properly connected to the corresponding connector in the communication device, that is, the mating gap of the connector of the communication device board 10 and the corresponding connector in the communication device reaches a preset threshold range, the other end 22 of the inner side of the conductive resilient sheet 20 is in contact with the contact position 12, and the contact position 12 is successfully connected to the fixed position 11, as illustrated in FIG. 3C. At this time, the logic chip 15 may detect that the level of the contact position 12 changes from the high level to a low level and stays at the low level. A circuit diagram showing a working principle is shown in FIG. 3D.

When detecting a transition of the level of the contact position 12 from the high level to the low level, the logic chip 15 may generate a corresponding level transition signal (referred to as a first level transition signal), and a user (for example, an administrator) may determine that the communication device board 10 is properly plugged-in based on the first level transition signal.

It is to be noted that if the first level transition signal generated by the logic chip 15 is not detected when the communication device board 10 is inserted, it may be determined that an abnormality occurs during the insertion. At this time, corresponding measures may be taken based on actual situations.

In this manner, when the communication device board 10 in a normal working state is unplugged (man-made or malfunction), a region in which the other end 22 of the inner side of the conductive resilient sheet 20 is in contact with the connector of the communication device board 10 may gradually go close to the fixed position 11 from the contact position 12. As the communication device board 10 is unplugged, the connector of the communication device board 10 is gradually separated from the corresponding connector in the communication device, and the mating gap of two connectors is gradually increased. When the mating gap between the connector of the communication device board 10 and the corresponding connector in the communication device exceeds an upper limit of the preset threshold range, the other end 22 of the inner side of the conductive resilient sheet 20 is no longer in contact with the contact position 12, and the contact position 12 is disconnected with the fixed position 11. At this time, the logic chip 15 may detect that the level of the contact position 12 changes from the low level to the high level and stays at the high level state.

When detecting a transition of the level of the contact position 12 from the low level to the high level, the logic chip 15 may generate a corresponding level transition signal (referred to as a second level transition signal), and a user (for example, an administrator) may determine that the communication device board 10 is unplugged based on the second level transition signal.

Figure 3E:
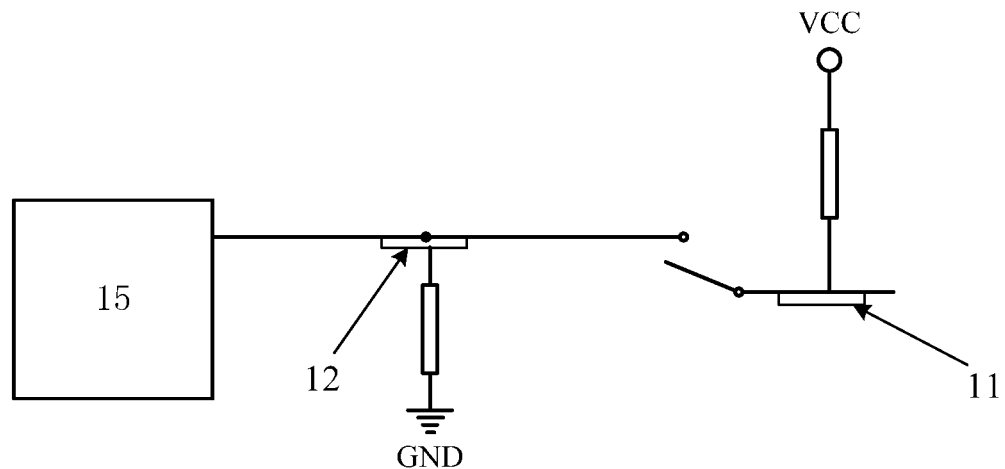

In another manner of the example, a circuit diagram illustrating an operation principle of the communication device board may be as shown in FIG. 3E, where the fixed position 11 of the connector of the communication device board 10 is connected to a preset power supply, and the contact position 12 is grounded.

In this manner, when the connector of the communication device board 10 is not connected to the corresponding connector in the communication device, the other end 22 of the inner side of the conductive resilient sheet 20 is in contact with a region other than the contact position 12 of the connector of the communication device board 10. At this time, the logic chip 15 detects that the contact position 12 is at a low level.

When the communication device board 10 is inserted into the communication device and the connector of the communication device board 10 is gradually and closely connected to the corresponding connector in the communication device, the other end 22 of the inner side of the conductive resilient sheet 20 gradually goes close to the contact position 12 since the conductive resilient sheet 20 is subject to a force. When the connector of the communication device board 10 is properly connected to the corresponding connector in the communication device, that is, when the mating gap between the connector of the communication device board 10 and the corresponding connector in the communication device reaches a preset threshold range, the other end 22 of the inner side of the conductive resilient sheet 20 is in contact with the contact position 12, and the contact position 12 is successfully connected with the fixed position 11. At this time, the logic chip 15 may detect that the level of the contact position 12 changes from the low level to a high level and stays at the high level state.

When detecting a transition of the level of the contact position 12 from the low level to the high level, the logic chip 15 may generate a corresponding level transition signal (referred to as a third level transition signal), and a user (for example, an administrator) may determine that the communication device board 10 is properly inserted based on the third level transition signal.

It is to be noted that if the third level transition signal generated by the logic chip 15 is not detected when the communication device board 10 is inserted, it may be determined that an abnormality occurs during the insertion. At this time, corresponding measures may be taken based on an actual situation.

In this manner, when the communication device board 10 in a normal working state is unplugged (man-made or malfunction), a region in which the other end 22 of the inner side of the conductive resilient sheet 20 is in contact with the connector of the communication device board 10 may gradually close toward the fixed position 11 from the contact position 12. As the communication device board 10 is unplugged, the connector of the communication device board 10 is gradually separated from the corresponding connector in the communication device, and the mating gap of two connectors may be gradually increased. When the mating gap between the connector of the communication device board 10 and the corresponding connector in the communication device exceeds an upper limit of the preset threshold range, the other end 22 of the inner side of the conductive resilient sheet 20 is no longer in contact with the contact position 12, and the contact position 12 is disconnected with the fixed position 11. At this time, the logic chip 15 may detect that the level of the contact position 12 changes from the high level to the low level and stays at the low level state.

When detecting a transition of the level of the contact position 12 from the high level to the low level, the logic chip 15 may generate a corresponding level transition signal (referred to as a fourth level transition signal), and a user (for example, an administrator) may determine that the communication device board 10 is unplugged based on the fourth level transition signal.

Therefore, in this manner, whether the communication device board is properly inserted or unplugged may be determined by detecting a level change of the contact position 12.

Example 2

Figure 4A:
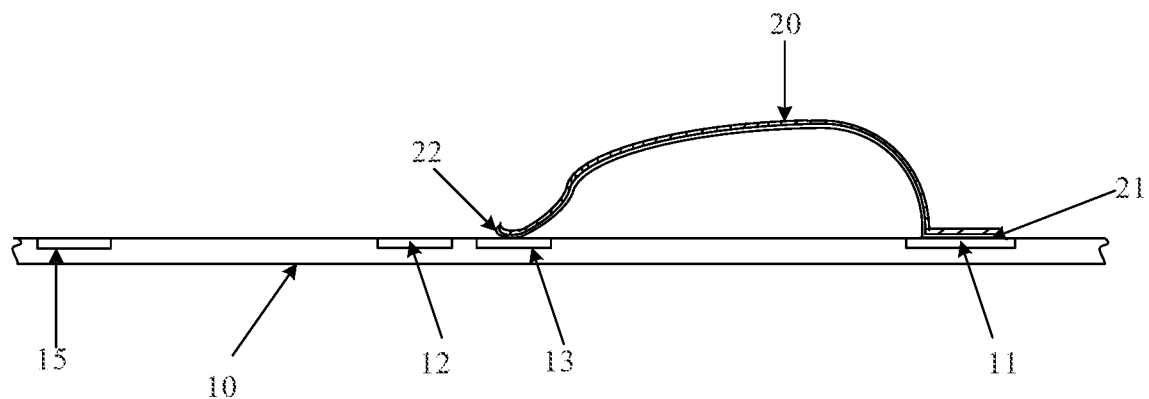
FIGS. 4A-4E are schematic diagrams and circuit diagrams of a communication device board based on a second example.

FIG. 4A is a structural diagram of a communication device board provided based on an example of the present disclosure. As shown in FIG. 4A, on the basis of the communication device board shown in FIG. 3A, the communication device board 10 may also include a contact position 13, where a level of the contact position 13 is different from the level of the fixed position 11.

When the fixed position 11 is fixedly connected to one end 21 of the inner side of the conductive resilient sheet 20 and the mating gap between the connector of the communication device board 10 and the corresponding connector in the communication device is greater than an upper limit of a preset threshold range, the other end 22 of the inner side of the conductive resilient sheet 20 is in contact with the contact position 13.

In this example, to obtain a mating state between the connector of the communication device board 10 and the corresponding connector in the communication device more accurately, the connector of the communication device board 10 may also include another contact position (e.g., the contact position 13 shown in FIG. 4A), where the contact position 13 is closer to the fixed position 11 than the contact position 12. The contact position 13 and the fixed position 11 also have different levels.

Correspondingly, the logic chip 15 may be connected to the contact position 12 and the contact position 13 respectively, so as to detect level state changes of the contact position 12 and the contact position 13 and generate corresponding level transition signals.

Figure 4B:
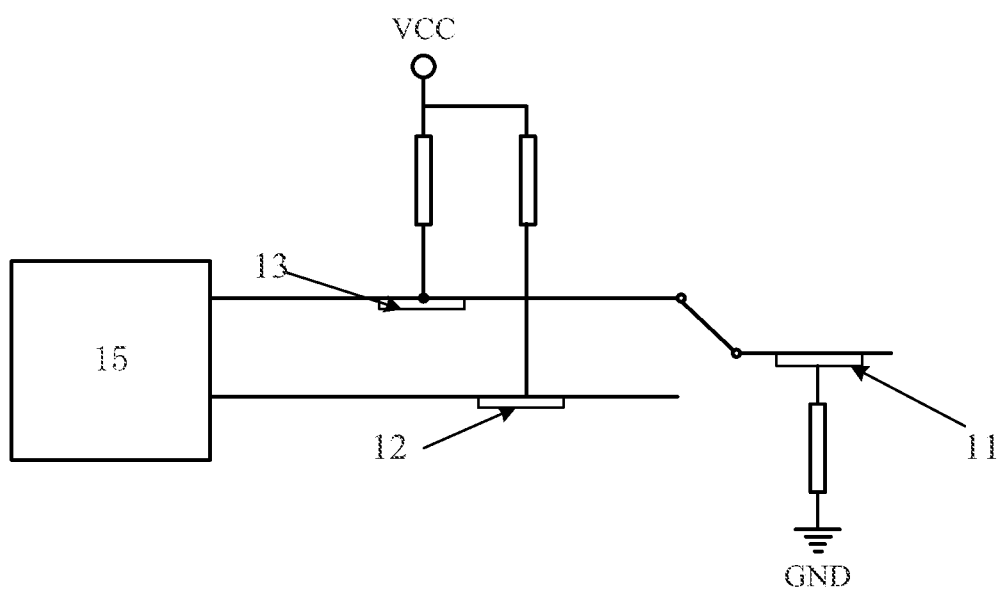

In one manner of the example, a circuit diagram illustrating an operation principle of the communication device board may be as shown in FIG. 4B, where the fixed position 11 of the connector of the communication device board 10 is grounded, and the contact position 12 and the contact position 13 are connected to a preset power supply.

In this manner, when the connector of the communication device board 10 is not connected to the corresponding connector in the communication device, the other end 22 of the inner side of the conductive resilient sheet 20 is in contact with the contact position 13 of the connector of the communication device board 10 as shown in FIG. 4A. At this time, the logic chip 15 may detect that the contact position 13 is at a low level, and the contact position 12 is at a high level.

When the communication device board 10 is plugged into the communication device and the connector of the communication device board 10 begins to connect to the corresponding connector in the communication device, the other end 22 of the inner side of the conductive resilient sheet 20 gradually goes close to the contact position 12 since the conductive resilient sheet 20 is subject to a force. When the connector of the communication device board 10 is connected to the corresponding connector in the communication device to a certain extent, the other end 22 of the inner side of the conductive resilient sheet 20 is no longer in contact with the contact position 13, and the contact position 13 is disconnected with the fixed position 11. The logic chip 15 may detect that the level of the contact position 13 changes from the low level to a high level and stays at the high level state, while the contact position 12 still stays at the high level state.

When detecting a transition of the level of the contact position 13 from the low level to the high level, the logic chip 15 may generate a corresponding level transition signal (referred to as a fifth level transition signal), and a user (for example, an administrator) may determine that the connector of the communication device board 10 is already connected to the corresponding connector in the communication device, but does not yet complete the connection (e.g., in an under-mating state in which the mating gap between the connector of the communication device board 10 and the corresponding connector in the communication device is greater than an upper limit of a preset threshold range) based on the fifth level transition signal.

Figure 4C:
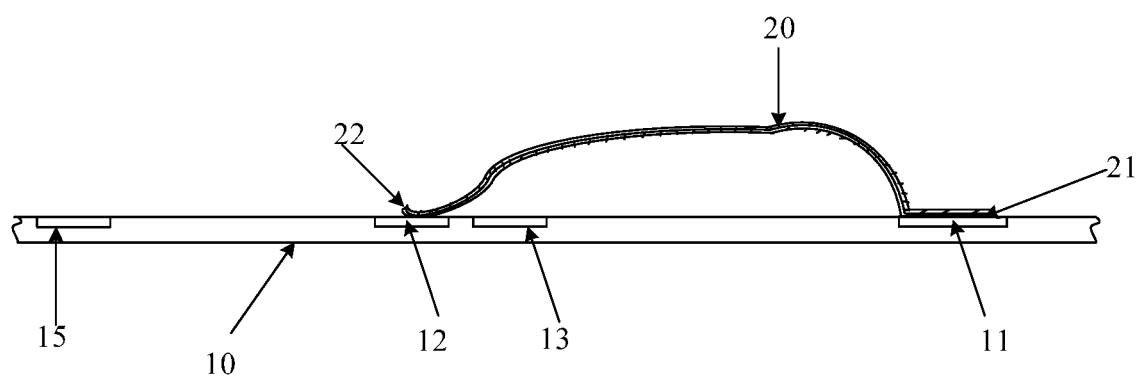
Figure 4D:
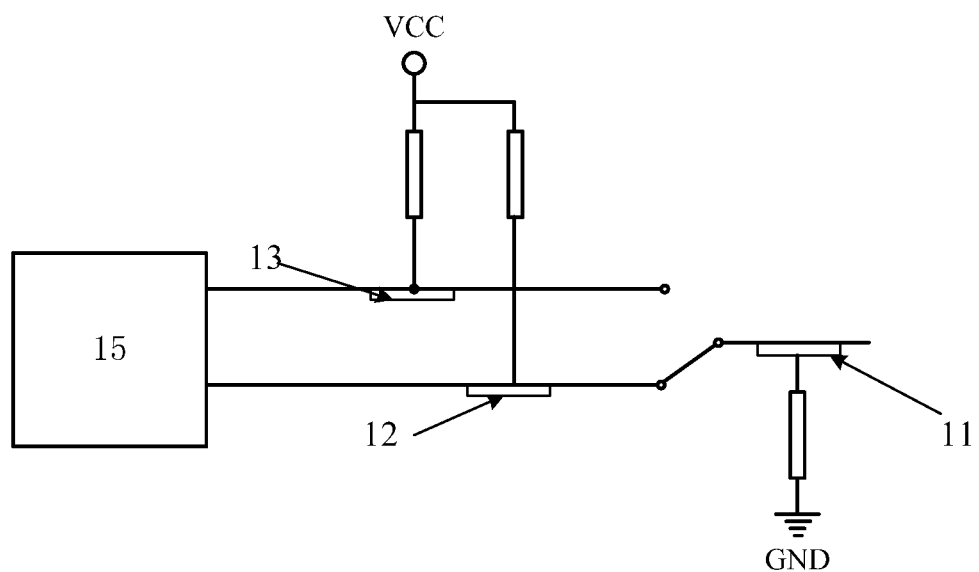

As the communication device board 10 is continuously inserted, the connector of the communication device board 10 is gradually and closely connected to the corresponding connector in the communication device and the other end 22 of the inner side of the conductive resilient sheet 20 continuously closes toward the contact position 12. When the connector of the communication device board 10 is properly connected to the corresponding connector in the communication device, that is, the mating gap between the connector of the communication device board 10 and the corresponding connector in the communication device reaches the preset threshold range, the other end 22 of the inner side of the conductive resilient sheet 20 is in contact with the contact position 12, and the contact position 12 is successfully connected to the fixed position 11, as shown in FIG. 4C. At this time, the logic chip 15 may detect that the level of the contact position 12 changes from the high level to a low level and stays at the low level state and the contact position 13 remains the high level state, a circuit diagram illustrating an operation principle of which may be as shown in FIG. 4D.

When detecting a transition of the level of the contact position 12 from the high level to the low level, the logic chip 15 may generate a corresponding level transition signal (referred to as a sixth level transition signal), and a user (for example, an administrator) may determine that the communication device board 10 is properly inserted based on the sixth level transition signal.

It is to be noted that in this manner, level state changes of the contact position 12 and the contact position 13 when the communication device board 10 is unplugged are opposite to those when the communication device board 10 is inserted, and a specific implementation thereof will not be described herein.

Figure 4E:
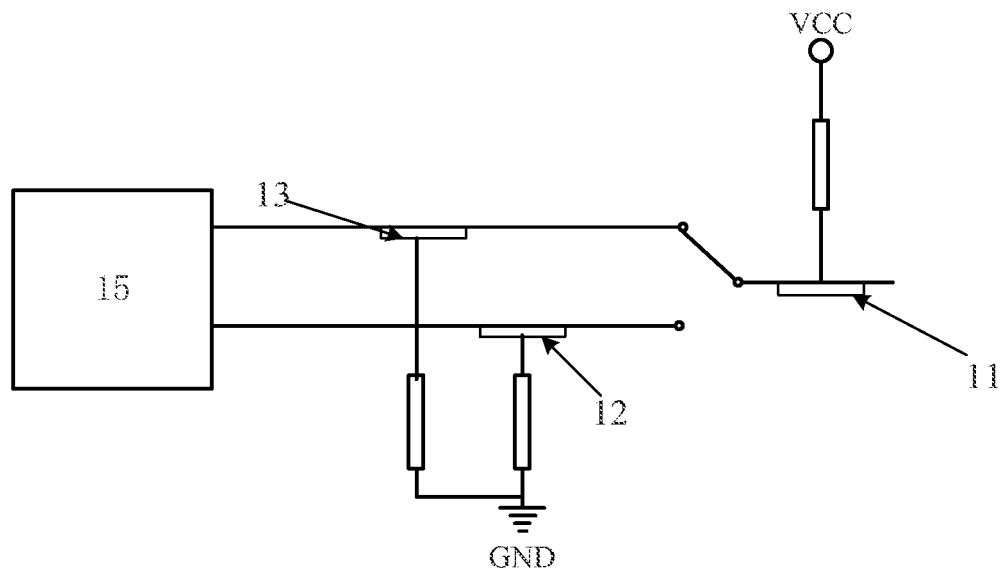

In another manner of the example, a circuit diagram illustrating an operation principle of a communication device board may be as shown in FIG. 4E, where the fixed position 11 of the connector of the communication device board 10 is connected to a preset power supply, and the contact position 12 and the contact position 13 are grounded.

In this manner, when the connector of the communication device board 10 is not connected to the corresponding connector in the communication device, the other end 22 of the inner side of the conductive resilient sheet 20 is in contact with the contact position 13 of the connector of the communication device board 10. At this time, the logic chip 15 may detect that the contact position 13 is at a high level, and the contact position 12 is at a low level.

When the communication device board 10 is plugged into the communication device and the connector of the communication device board 10 begins to connect to the corresponding connector in the communication device, the other end 22 of the inner side of the conductive resilient sheet 20 gradually closes toward the contact position 12 since the conductive resilient sheet 20 is subject to a force. When the connector of the communication device board 10 is connected to the corresponding connector in the communication device to a certain extent, the other end 22 of the inner side of the conductive resilient sheet 20 is no longer in contact with the contact position 13, and the contact position 13 is disconnected with the fixed position 11. The logic chip 15 may detect that the level of the contact position 13 changes from the high level to a low level and stays at the low level state, while the contact position 12 still stays at the low level state.

When detecting a transition of the level of the contact position 13 from the high level to the low level, the logic chip 15 may generate a corresponding level transition signal (referred to as a seventh level transition signal), and a user (for example, an administrator) may determine that the connector of the communication device board 10 is already connected to the corresponding connector in the communication device, but does not yet complete the connection based on the seventh level transition signal.

As the communication device board 10 is continuously inserted, the connector of the communication device board 10 is gradually and closely connected to the corresponding connector in the communication device, and the other end 22 of the inner side of the conductive resilient sheet 20 continuously closes toward the contact position 12. When the connector of the communication device board 10 is properly connected to the corresponding connector in the communication device, that is, the mating gap between the connector of the communication device board 10 and the corresponding connector in the communication device reaches the preset threshold range, the other end 22 of the inner side of the conductive resilient sheet 20 is in contact with the contact position 12, and the contact position 12 is successfully connected to the fixed position 11. At this time, the logic chip 15 may detect that the level of the contact position 12 changes from the low level to a high level and stays at the high level state. The contact position 13 still remains the low level state.

When detecting a transition of the level of the contact position 12 from the low level to the high level, the logic chip 15 may generate a corresponding level transition signal (referred to as an eighth level transition signal), and a user (for example, an administrator) may determine that the communication device board 10 is properly inserted based on the eighth level transition signal.

It is to be noted that in this manner, level state changes of the contact position 12 and the contact position 13 when the communication device board 10 is removed are opposite to those when the communication device board 10 is inserted, and a specific implementation thereof will not be described herein.

Thus, in this example, whether the communication device board 10 is properly inserted or in the under-mating state may be determined by detecting the level changes of the contact position 12 and the contact position 13.

Example 3

Figure 5A:
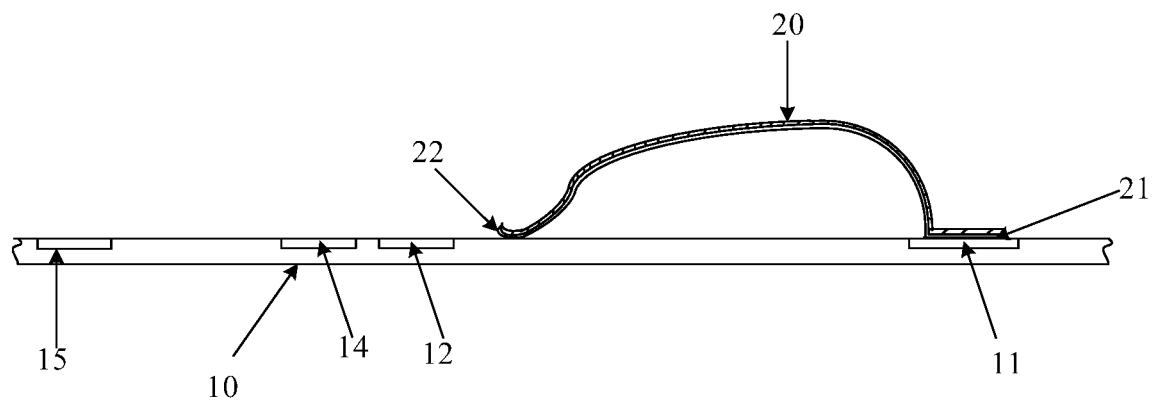
FIGS. 5A-5G are schematic diagrams and circuit diagrams of a communication device board based on a third example.

FIG. 5A is a structural diagram of a communication device board provided based on an example of the present disclosure. As shown in FIG. 5A, on the basis of the communication device board shown in FIG. 3A, the communication device board 10 may also include a contact position 14, where a level of the contact position 14 is different with a level of the fixed position 11.

When the fixed position 11 is fixedly connected to one end 21 of the inner side of the conductive resilient sheet 20 and the mating gap between the connector of the communication device board 10 and the corresponding connector in the communication device is less than a lower limit of a preset threshold range, the other end 22 of the inner side of the conductive resilient sheet 20 is in contact with the contact position 14.

In this example, to obtain a mating state between the connector of the communication device board 10 and the corresponding connector in the communication device more accurately, the connector of the communication device board 10 may also include another contact position (e.g., the contact position 14 shown in FIG. 5A). The contact position 14 is farther from the fixed position 11 than the contact position 12, and the contact position 14 and the fixed position 11 also have different levels.

Correspondingly, the logic chip 15 may be connected to the contact position 12 and the contact position 14 respectively, so as to detect level state changes of the contact position 12 and the contact position 14 and generate corresponding level transition signals.

Figure 5B:
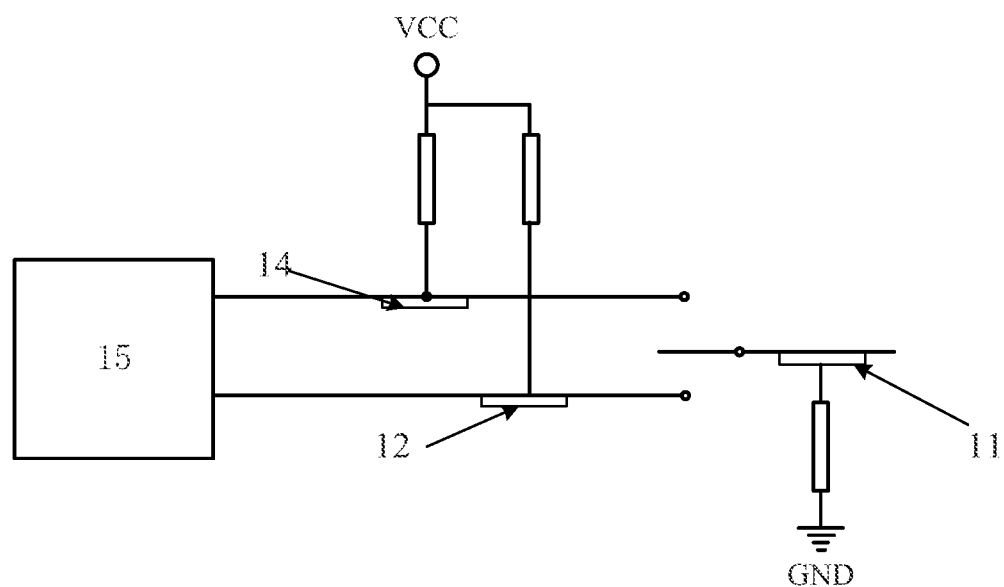

In one manner of the example, a circuit diagram illustrating an operation principle of the communication device board may be shown in FIG. 5B, where the fixed position 11 of the connector of the communication device board 10 is grounded, and the contact position 12 and the contact position 14 are connected to a preset power supply.

Figure 5C:
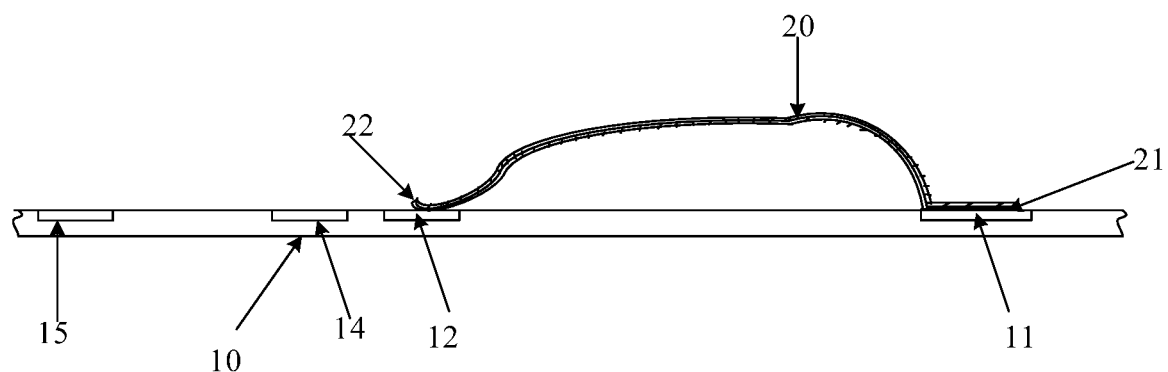
Figure 5D:
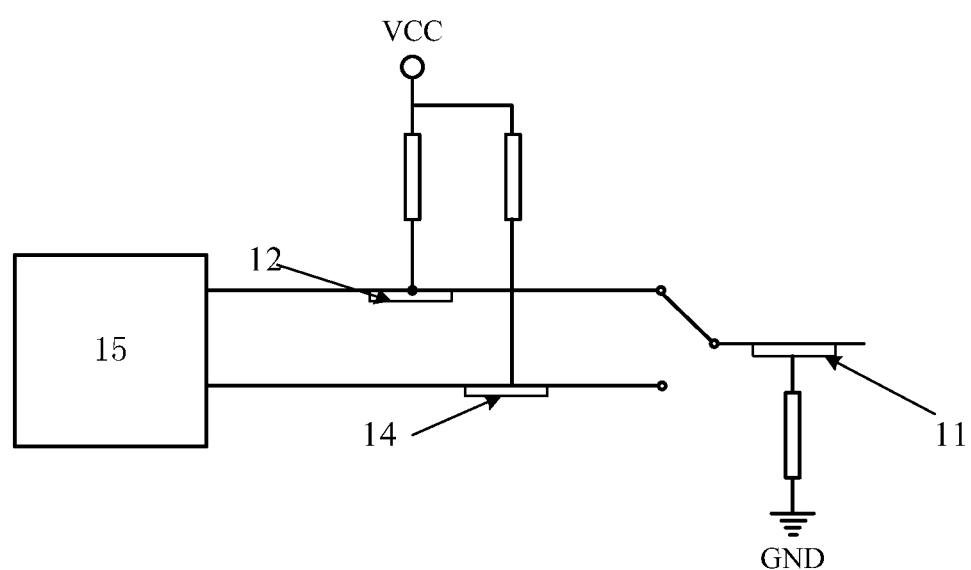

In this manner, when the communication device board 10 is inserted into the communication device and the connector of the communication device board 10 is gradually and closely connected to the corresponding connector in the communication device, the other end 22 of the inner side of the conductive resilient sheet 20 gradually closes toward the contact position 12 since the conductive resilient sheet 20 is subject to a force. When the connector of the communication device board 10 is properly connected to the corresponding connector in the communication device, that is, the mating gap between the connector of the communication device board 10 and the corresponding connector in the communication device reaches the preset threshold range, the other end 22 of the inner side of the conductive resilient sheet 20 is in contact with the contact position 12, and the contact position 12 is successfully connected to the fixed position 11, as shown in FIG. 5C. At this time, the logic chip 15 may detect that the level of the contact position 12 changes from a high level to a low level and stays at the low level state, and the contact position 14 is still at a high level. A circuit diagram of which may be shown in FIG. 5D.

When detecting a transition of the level of the contact position 12 from the high level to the low level, the logic chip 15 may generate a corresponding level transition signal (referred to as a ninth level transition signal), and a user (for example, an administrator) may determine that the communication device board 10 is properly inserted based on the ninth level transition signal.

Figure 5E:
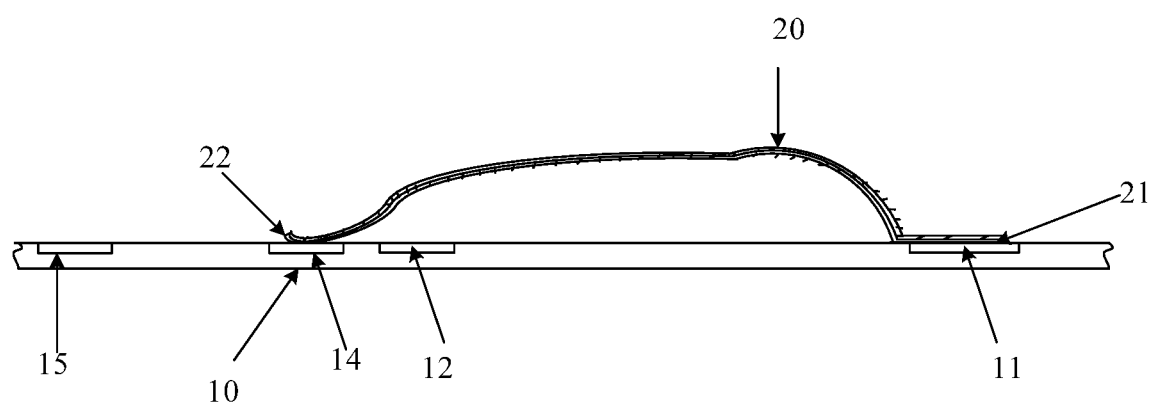
Figure 5F:
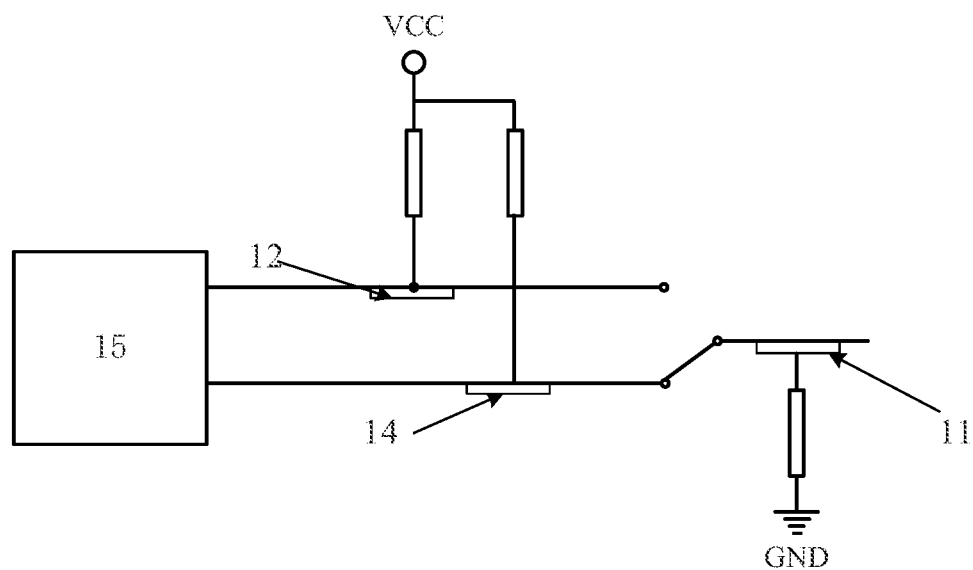

In this manner, if the user (for example, the administrator) continues to insert the communication device board 10 after it is properly inserted, the other end 22 of the inner side of the conductive resilient sheet 20 may gradually close toward the contact position 14. When the connector of the communication device board 10 and the corresponding connector in the communication device are in an over-mating state (that is, the mating gap between the connector of the communication device board 10 and the corresponding connector in the communication device is less than the lower limit of the preset threshold range), the other end 22 of the inner side of the conductive resilient sheet 20 is no longer in contact with the contact position 12, but changes to be in contact with the contact position 14. At this time, the contact position 14 is successfully connected to the fixed position 11, as shown in FIG. 5E. At this time, the logic chip 15 may detect that the level of the contact position 14 changes from the high level to a low level and stays at the low level state and the contact position 12 changes to the high level. A circuit diagram of which may be as shown in FIG. 5F.

When detecting a transition of the level of the contact position 14 from the high level to the low level, the logic chip 15 may generate a corresponding level transition signal (referred to as a tenth level transition signal), and a user (for example, an administrator) may determine that the communication device board 10 is inserted too tightly based on the tenth level transition signal.

It is to be noted that in this manner, level state changes of the contact position 12 and the contact position 14 when the communication device board 10 is removed are opposite to those when the communication device board 10 is inserted, and a specific implementation thereof will not be described herein.

Figure 5G:
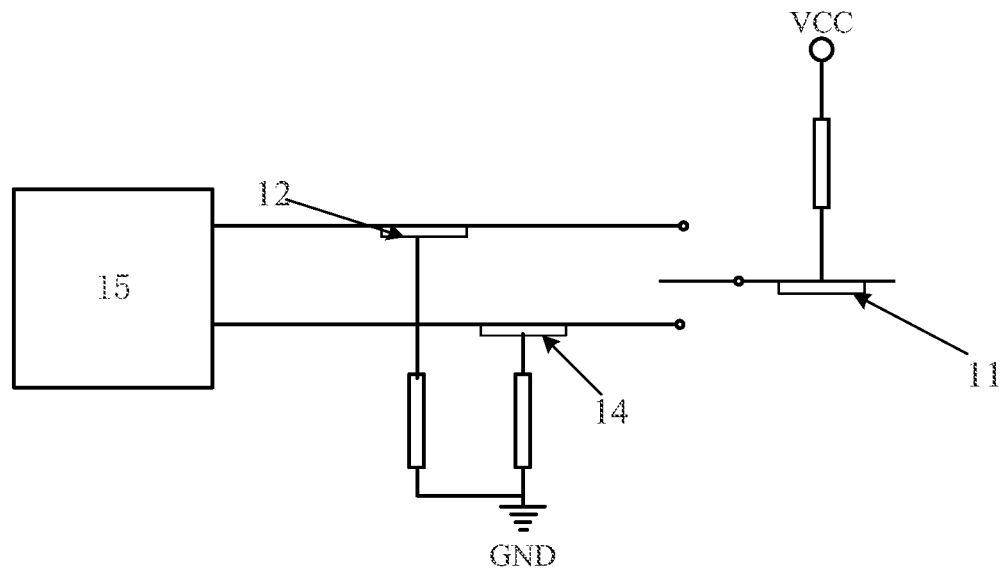

In another manner of the example, a circuit diagram of the communication device board may be as shown in FIG. 5G, where the fixed position 11 of the connector of the communication device board 10 is connected to a preset power supply, and the contact position 12 and the contact position 14 are grounded.

In this manner, when the communication device board 10 is inserted, level state changes of the contact position 12 and the contact position 14 are opposite to those when the communication device board 10 is inserted in the above manner, and a specific implementation thereof will not be described herein. Similarly, when the communication device board 10 is removed, the level state changes of the contact position 12 and the contact position 14 are opposite to the level state changes of the contact position 12 and the contact position when the communication device board 10 is removed in the above manner, and a specific implementation thereof will not be described herein.

Therefore, in this manner, whether the communication device board is properly inserted or in the over-mating state may be determined by detecting the level changes of the contact position 12 and the contact position 14.

Example 4

Figure 6A:
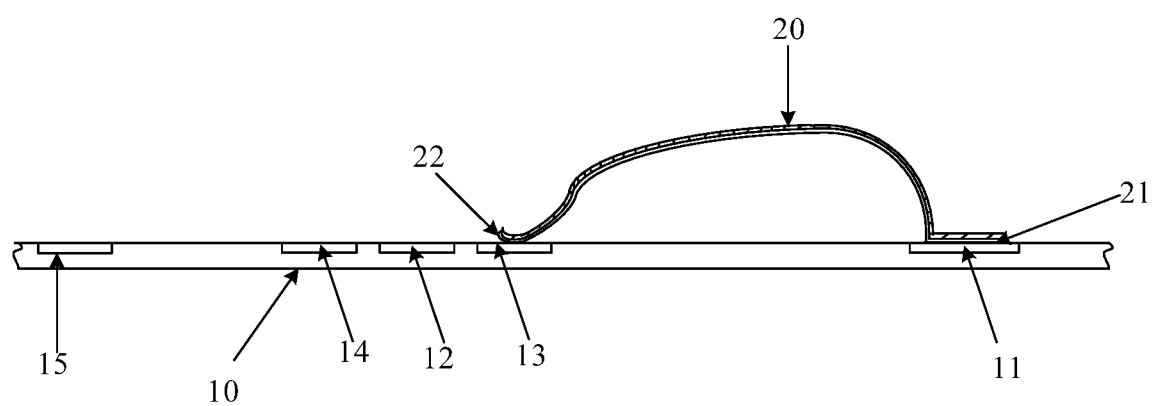
FIGS. 6A-6G are schematic diagrams and circuit diagrams of a communication device board based on a fourth example.

FIG. 6A is a structural diagram of a communication device board provided based on an example of the present disclosure. As shown in FIG. 6A, on the basis of the communication device board shown in FIG. 3A, the communication device board 10 may also include a contact position 13 and a contact position 14, where a level of the contact position 13 is different from a level of the fixed position 11 and a level of the contact position 14 is also different from the level of the fixed position 11.

When the fixed position 11 is fixedly connected to one end 21 of the inner side of the conductive resilient sheet 20 and the mating gap between the connector of the communication device board 10 and the corresponding connector in the communication device is greater than an upper limit of a preset threshold range, the other end 22 of the inner side of the conductive resilient sheet 20 is in contact with the contact position 13.

When the fixed position 11 is fixedly connected to one end 21 of the inner side of the conductive resilient sheet 20 and the mating gap between the connector of the communication device board 10 and the corresponding connector in the communication device is less than a lower limit of the preset threshold range, the other end 22 of the inner side of the conductive resilient sheet 20 is in contact with the contact position 14.

Figure 6B:
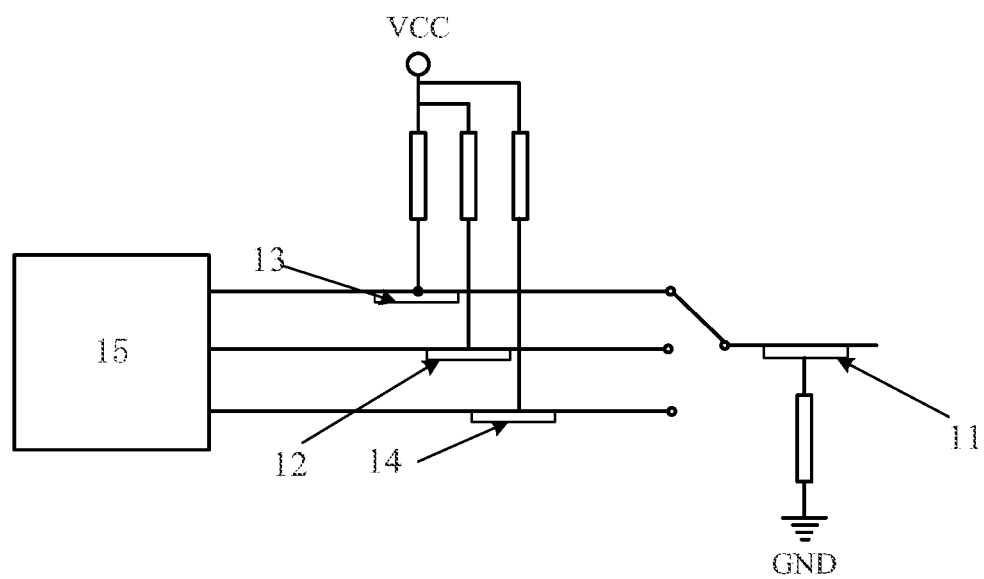

In a manner of the example, a circuit diagram illustrating an operation principle of the communication device board may be as shown in FIG. 6B, where the fixed position 11 of the connector of the communication device board 10 is grounded, and the contact position 12, the contact position 13 and the contact position 14 are connected to a preset power supply.

Figure 6C:
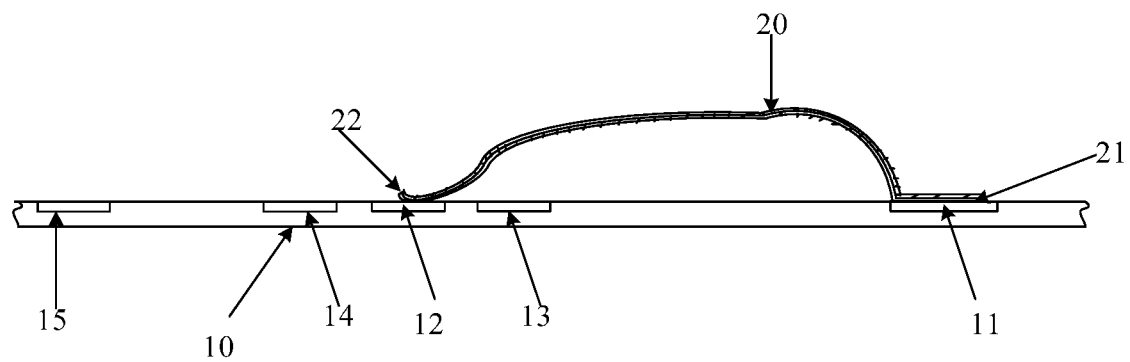
Figure 6D:
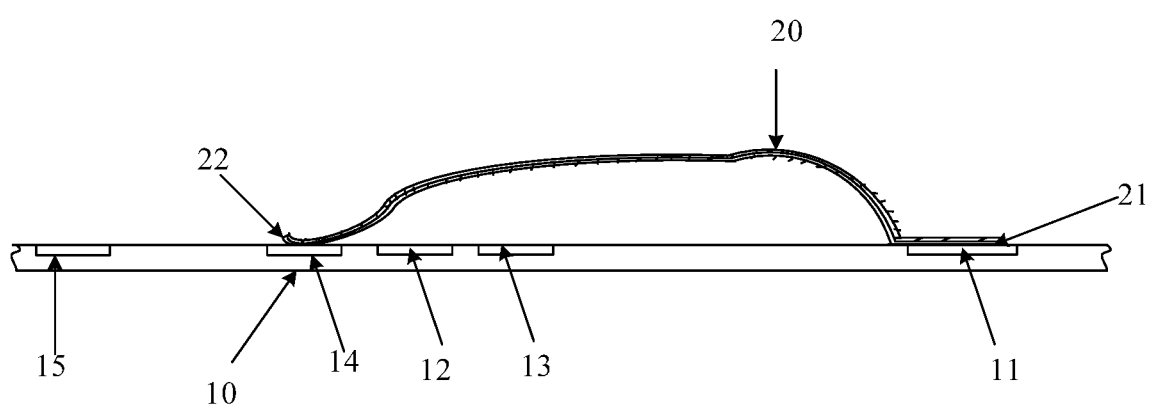
Figure 6E:
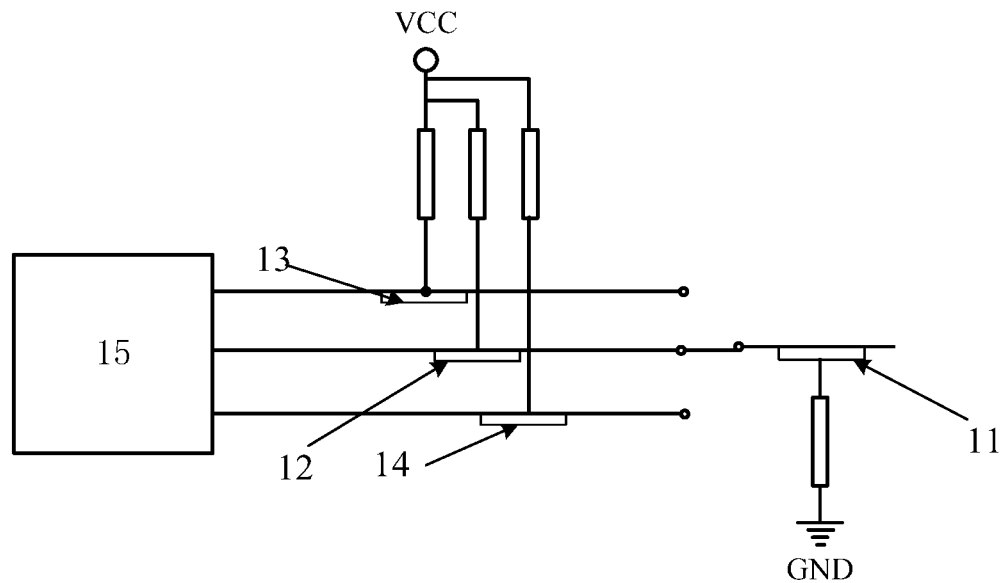
Figure 6F:
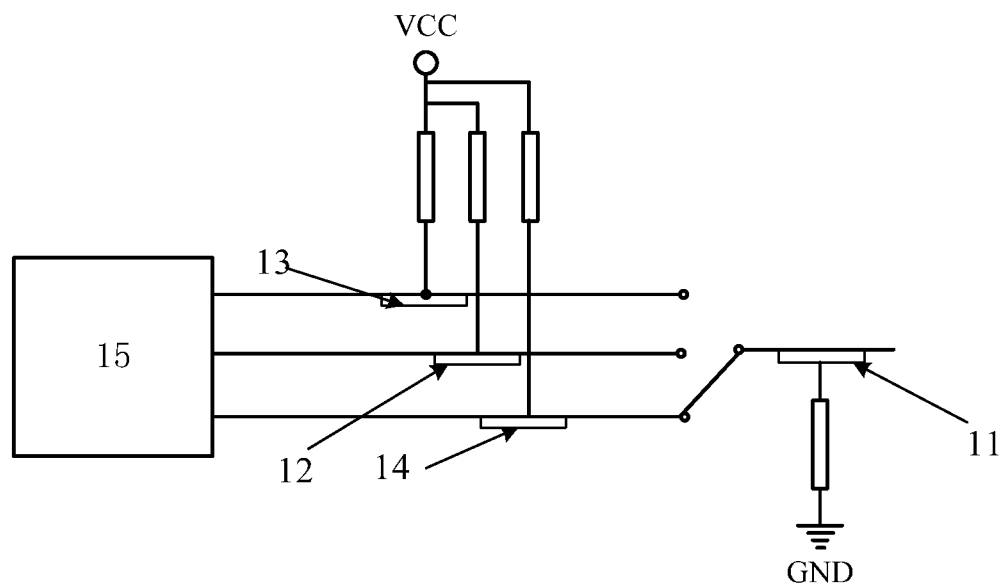

In this manner, when the communication device board 10 is inserted, situations for contact between the other end 22 of the inner side of the conductive resilient sheet 20 and the connector of the communication device board 10 are shown in FIG. 6A, FIG. 6C and FIG. 6D respectively. Connection relationships of the circuit diagrams of the communication device board 10 may be as shown in FIG. 6B, FIG. 6E and FIG. 6F respectively, where FIG. 6A corresponds to FIG. 6B, FIG. 6C corresponds to FIG. 6E, and FIG. 6D corresponds to FIG. 6F.

When the communication device board 10 is inserted, a level change of each of the contact positions 12, 13 and 14 may be referred to the related descriptions in Example 2 and Example 3 respectively, which will not be described in this example of the present disclosure.

It is to be noted that level state changes of the contact position 12, the contact position 13 and the contact position 14 when the communication device board 10 is unplugged are opposite to those when the communication device board 10 is inserted, and a specific implementation thereof will not be described herein.

Figure 6G:
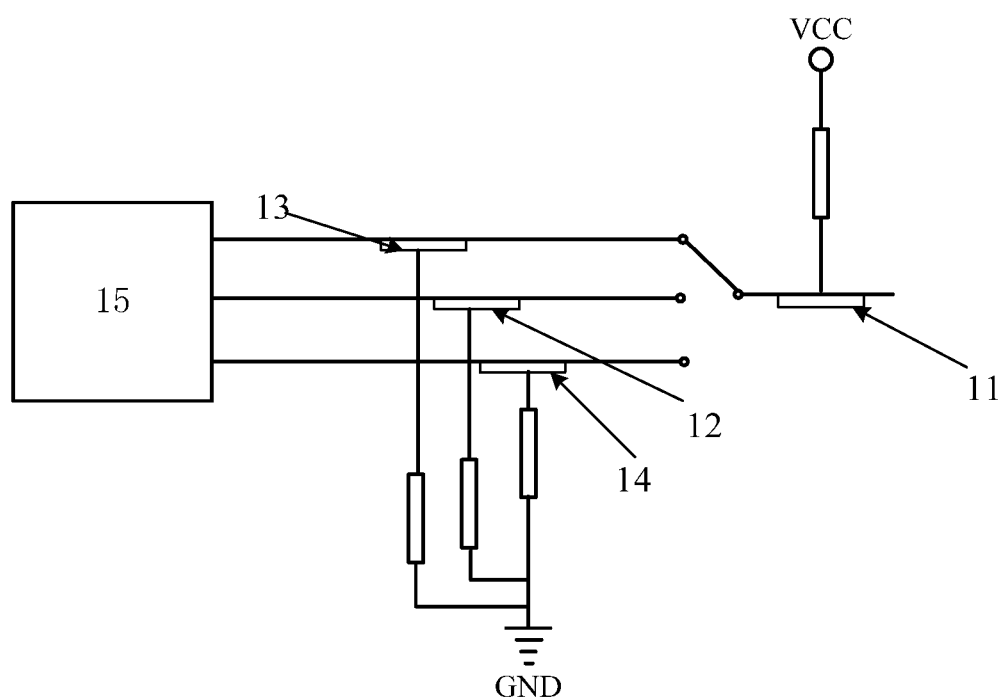

In another manner of the example, a circuit diagram illustrating an operation principle of the communication device board may be as shown in FIG. 6G, where the fixed position 11 of the connector of the communication device board 10 is connected to a preset power supply, and the contact position 12, the contact position 13 and the contact position 14 are grounded.

In this manner, when the communication device board 10 is inserted, level state changes of the contact position 12, the contact position 13 and the contact position 14 are opposite to those when the communication device board 10 is inserted in the above manner, and a specific implementation will not be described herein. Similarly, when the communication device board 10 is removed, level state changes of the contact position 12, the contact position 13 and the contact position 14 are opposite to those when the communication device board 10 is removed in the above manner, and a specific implementation will not be described herein.

Therefore, in this example, whether the communication device board is properly inserted, in the over-mating state, or in the under-mating state may be determined by detecting the level changes of the contact position 12, the contact position 13 and the contact position 14.

It shall be understood that all of the above examples are merely several specific examples illustrating arrangement of contact positions on the connector of the communication device board 10, but do not limit the scope of protection of the present disclosure. In examples of the present disclosure, four or more contact positions may also be arranged on the connector of the communication device board 10 to obtain insertion condition of the communication device board 10 more accurately by detecting a level change of each of the contact positions, and a specific implementation thereof will not be described herein.

In an example of the present disclosure, the logic chip 15 may generate a corresponding level transition signal based on the detected level change of each of the contact positions, and then store the level transition signal in a register. The corresponding level transition signal may be read from the register by controlling a Center Process Unit (CPU) by a user (for example, an administrator) through corresponding control instructions, and displayed to the user for viewing, so as to accurately obtain the insertion condition of the communication device board.

In another example of the present disclosure, after generating a level transition signal based on the detected level change of each of the contact positions, the logic chip 15 may directly output the level transition signal, for example, output the generated level transition signal to a CPU. The CPU may display the signal to a user in a specified functional interface, so that the user may accurately obtain the insertion condition of the communication device board.

It may be seen from the above description that, in the technical solutions of the examples of the present disclosure, the fixed position and the contact position with different levels may be arranged on the connector of the communication device board, and the fixed position of the connector of the communication device board is fixedly connected to one end of the inner side of the conductive resilient sheet. When the mating gap between the connector of the communication device board and the corresponding connector in the communication device is smaller than the preset threshold range, the other end of the inner side of the conductive resilient sheet is in contact with the contact position 12. In this way, whether the communication device board is properly inserted may be determined based on the level change of the contact position 12.

Further, an example of the present disclosure also provides a communication device, which may include a communication device board described in any one of the above examples.

After considering the specification and practicing the present disclosure, the persons of skill in the prior art may easily conceive of other implementations of the present disclosure. The present disclosure is intended to include any variations, uses and adaptive changes of the present disclosure. These variations, uses and adaptive changes follow the general principle of the present disclosure and include common knowledge or conventional technical means in the prior art not disclosed in the present disclosure. The specification and examples herein are intended to be illustrative only and the real scope and spirit of the present disclosure are indicated by the claims of the present disclosure.

It is to be understood that the present disclosure is not limited to the precise structures described above and shown in the accompanying drawings and may be modified or changed without departing from the scope of the present disclosure. The scope of protection of the present disclosure is limited only by the appended claims.

The invention claimed is:

1. A communication device board, applied to a communication device, comprising:
   a connector of the communication device board comprises a fixed position and a first contact position, wherein a level of the fixed position is different from a level of the first contact position;
   the fixed position is fixedly connected to a first end of an inner side of a conductive resilient sheet, wherein an outer side of the conductive resilient sheet is provided with an insulating coating;
   when the fixed position is fixedly connected to the first end of the inner side of the conductive resilient sheet and a mating gap between the connector of the communication device board and a corresponding communication device connector is smaller than a preset threshold range, a second end of the inner side of the conductive resilient sheet is in contact with the first contact position.

2. The communication device board according to claim 1, wherein
the connector of the communication device board comprises a second contact position, wherein a level of the second contact position is different from the level of the fixed position
when the fixed position is fixedly connected to the first end of the inner side of the conductive resilient sheet and the mating gap between the connector of the communication device board and the corresponding communication device connector is larger than an upper limit of the preset threshold range, the second end of the inner side of the conductive resilient sheet is in contact with the second contact position.

3. The communication device board according to claim 2, wherein
the connector of the communication device board comprises a third contact position, wherein a level of the third contact position is different from the level of the fixed position;
when the fixed position is fixedly connected to the first end of the inner side of the conductive resilient sheet and the mating gap between the connector of the communication device board and the corresponding communication device connector is smaller than a lower limit of the preset threshold range, the second end of the inner side of the conductive resilient sheet is in contact with the third contact position.

4. The communication device board according to claim 1, wherein
the connector of the communication device board comprises a third contact position, wherein a level of the third contact position is different from the level of the fixed position;
when the fixed position is fixedly connected to the first end of the inner side of the conductive resilient sheet and the mating gap between the connector of the communication device board and the corresponding communication device connector is smaller than a lower limit of the preset threshold range, the second end of the inner side of the conductive resilient sheet is in contact with the third contact position.

5. The communication device board according to claim 1, further comprises a logic chip, wherein
the logic chip is connected to the first contact position and configured to detect level transitions of the first contact position and generate different level transition signals.

6. The communication device board according to claim 5, wherein
the fixed position connects to a preset power supply, and the first contact position connects to ground;
the logic chip connects to the first contact position; and
the logic chip is to generate a first level transition signal when detecting a transition of the level of the first contact position from a low level to a high level, and to generate a second level transition signal when detecting a transition of the level of the first contact position from the high level to the low level.

7. The communication device board according to claim 5, wherein
the fixed position connects to ground, and the first contact position connects to a preset power supply;
the logic chip connects to the first contact position; and
the logic chip is to generate a third level transition signal when detecting a transition of the level of the first contact position from a high level to a low level, and to generate a fourth level transition signal when detecting a transition of the level of the first contact position from the low level to the high level.

8. The communication device board according to claim 5, wherein
the logic chip is also configured to output the generated level transition signals.

9. A communication device, comprising a communication device board, wherein the communication device board comprises:
a connector of the communication device board comprises a fixed position and a first contact position, wherein a level of the fixed position is different from a level of the first contact position;
the fixed position is fixedly connected to a first end of an inner side of a conductive resilient sheet, wherein an outer side of the conductive resilient sheet is provided with an insulating coating;
when the fixed position is fixedly connected to the first end of the inner side of the conductive resilient sheet and a mating gap between the connector of the communication device board and a corresponding communication device connector is smaller than a preset threshold range, a second end of the inner side of the conductive resilient sheet is in contact with the first contact position.

10. The communication device according to claim 9, wherein
the connector of the communication device board comprises a second contact position, wherein a level of the second contact position is different from the level of the fixed position;
when the fixed position is fixedly connected to the first end of the inner side of the conductive resilient sheet and the mating gap between the connector of the communication device board and the corresponding communication device connector is larger than an upper limit of the preset threshold range, the second end of the inner side of the conductive resilient sheet is in contact with the second contact position.

11. The communication device according to claim 10, wherein
the connector of the communication device board comprises a third contact position, wherein a level of the third contact position is different from the level of the fixed position;
when the fixed position is fixedly connected to the first end of the inner side of the conductive resilient sheet and the mating gap between the connector of the communication device board and the corresponding communication device connector is smaller than a lower limit of the preset threshold range, the second end of the inner side of the conductive resilient sheet is in contact with the third contact position.

12. The communication device according to claim 9, wherein
the connector of the communication device board comprises a third contact position, wherein a level of the third contact position is different from the level of the fixed position;
when the fixed position is fixedly connected to the first end of the inner side of the conductive resilient sheet and the mating gap between the connector of the communication device board and the corresponding communication device connector is smaller than a lower limit of the preset threshold range, the second end of the inner side of the conductive resilient sheet is in contact with the third contact position.

13. The communication device according to claim 9, further comprises a logic chip, wherein
the logic chip is connected to the first contact position and configured to detect level transitions of the first contact position and generate different level transition signals.

14. The communication device according to claim 13, wherein
the fixed position connects to a preset power supply, and the first contact position connects to ground;
the logic chip connects to the first contact position; and
the logic chip is to generate a first level transition signal when detecting a transition of the level of the first contact position from a low level to a high level, and to generate a second level transition signal when detecting a transition of the level of the first contact position from the high level to the low level.

15. The communication device according to claim 13, wherein
the fixed position connects to ground, and the first contact position connects to a preset power supply;
the logic chip connects to the first contact position; and
the logic chip is to generate a third level transition signal when detecting a transition of the level of the first contact position from a high level to a low level, and to generate a fourth level transition signal when detecting a transition of the level of the first contact position from the low level to the high level.

16. The communication device according to claim 13, wherein the logic chip is also configured to output the generated level transition signals.

\* \* \* \* \*